United States Patent
Grundmann et al.

(10) Patent No.: US 8,445,904 B2
(45) Date of Patent: May 21, 2013

(54) TRANSPARENT RECTIFYING METAL/METAL OXIDE/SEMICONDUCTOR CONTACT STRUCTURE AND METHOD FOR THE PRODUCTION THEREOF AND USE

(75) Inventors: Marius Grundmann, Leipzig (DE); Heiko Frenzel, Leipzig (DE); Alexander Lajn, Leipzig (DE); Holger von Wenckstern, Leipzig (DE)

(73) Assignee: Universität Leipzig, Leipzig (DE)

( * ) Notice: Subject to any disclaimer, the term of this patent is extended or adjusted under 35 U.S.C. 154(b) by 0 days.

(21) Appl. No.: 13/380,054

(22) PCT Filed: Jun. 21, 2010

(86) PCT No.: PCT/EP2010/058726
§ 371 (c)(1), (2), (4) Date: Dec. 22, 2011

(87) PCT Pub. No.: WO2010/149616
PCT Pub. Date: Dec. 29, 2010

(65) Prior Publication Data
US 2012/0091453 A1    Apr. 19, 2012

(30) Foreign Application Priority Data
Jun. 22, 2009 (DE) .......... 10 2009 030 045

(51) Int. Cl.
H01L 29/10 (2006.01)
H01L 29/12 (2006.01)
H01L 23/48 (2006.01)
H01L 23/52 (2006.01)
H01L 29/40 (2006.01)

(52) U.S. Cl.
USPC ............................. 257/43; 257/77; 257/749

(58) Field of Classification Search
USPC ........................................... 257/43, 77, 749
See application file for complete search history.

(56) References Cited

U.S. PATENT DOCUMENTS

| 6,362,483 B1 | 3/2002 | Sou et al. |
| 7,285,857 B2 | 10/2007 | Kwak et al. |
| 7,341,932 B2 | 3/2008 | Aslam et al. |
| 7,432,577 B1 | 10/2008 | Weiss et al. |
| 2002/0008234 A1* | 1/2002 | Emrick et al. ............... 257/43 |
| 2006/0281291 A1 | 12/2006 | Dietz et al. |
| 2007/0206651 A1 | 9/2007 | Tsai et al. |

FOREIGN PATENT DOCUMENTS

| DE | 197 29 931 A1 | 1/1999 |
| DE | 199 51 207 A1 | 4/2001 |
| JP | 2003-523617 A | 8/2003 |
| JP | 2007-201393 A | 8/2007 |
| JP | 2008-235668 A | 10/2008 |
| WO | 01/15241 A1 | 3/2001 |
| WO | 2007/074969 A1 | 7/2007 |
| WO | 2008143526 A1 | 11/2008 |

OTHER PUBLICATIONS

Lin Yow-Jon: Hole transport barrier and band bending at the indium tin oxide/polymer/p-AlGaN interface; Applied Physics Letters; American Institute of Physics, Melville, NY, USA, vol. 89, No. 15; Oct. 13, 2006; pp. 152121-152121.
Wager et al: Transparent electronics: Schottky barrier and heterojunction considerations; Films; Elsevier Sequioa S.A., Lausanne, CH; vol. 516, No. 8; Feb. 1, 2008, pp. 1755-1764.
Yoon Jong-Gul et al:Characteristics of indium-tin oxide Shottky contacts to ZnMgO/ZnO heterojunction with band gap grading; Applied Physics Letters; Melville, NY, USA, vol. 95, No. 22; Dec. 1, 2009; pp. 222102-222102.
Chen H. L. et al: Characterization of sputtered NiO thin films; Surface & Coatings Technology 198 (2005) 138-142.

* cited by examiner

*Primary Examiner* — Matthew Smith
*Assistant Examiner* — Wilner Jean Baptiste
(74) *Attorney, Agent, or Firm* — Gudrun E. Huckett

(57) ABSTRACT

The invention relates to transparent rectifying contact structures for application in electronic devices, in particular appertaining to optoelectronics, solar technology and sensor technology, and also a method for the production thereof. The transparent rectifying contact structure according to the invention has the following constituents: a) a transparent semiconductor, b) a transparent, non-insulating and non-conducting layer composed of metal oxide, metal sulphide and/or metal nitride, the resistivity of which is preferably in the range of $10^2$ Ωcm to $10^7$ Ωcm and c) a layer composed of a transparent electrical conductor wherein the layer b) is formed between the semiconductor a) and the layer c) and the composition of the layer b) is defined in greater detail in the description of the patent.

17 Claims, No Drawings

TRANSPARENT RECTIFYING METAL/METAL OXIDE/SEMICONDUCTOR CONTACT STRUCTURE AND METHOD FOR THE PRODUCTION THEREOF AND USE

BACKGROUND OF THE INVENTION

A contact structure is proposed that is preferably embodied as a transparent layer system and has rectifying properties. Moreover, a method for creating such a contact structure is disclosed and possibilities for its use are disclosed. In this connection, the contact structure is at least comprised of a, preferably transparent, semiconductor, a transparent metal oxide, and a transparent electrical conductor.

Multi-layer contact structures that have insulating or conducting properties are known in the prior art. In this connection, in case of the insulating contact structures metal insulator semiconductor junctions (MIS) known from the silicon industry or, more specifically, metal oxide semiconductor junctions (MOS) are realized. They are used for producing MIS diodes (for example, for detection of electromagnetic radiation) and MOS field effect transistors (MOSFETs).

In the field of conducting contacts, there are, on the one hand, ohmic contacts of transparent ohmic conducting oxides (transparent conductive oxides, TCO) and, on the other hand, non-transparent metal contacts (ohmic or rectifying).

DE 199 51 207 A1 discloses a semiconductor component for detection of electromagnetic radiation. In particular, UV radiation is to be measured and the measurements are not to be falsified by visible light. For this reason, a layer construction is used that is transparent in the visible wavelength range. On a glass substrate a contact layer of a transparent metallically conducting oxide (TCO), here a fluorine-doped tin oxide, or a metal is arranged. Above, a layer of a metal oxide compound semiconductor is provided in which the impinging UV radiation is to be absorbed. As an uppermost layer, a metal layer is provided that forms with the semiconductor layer underneath a Schottky contact. The metal layer should have a thickness of up to 20 nm in order to ensure its transparency. 20-30% of the UV radiation pass through the metal layer.

U.S. Pat. No. 7,341,932 B2 discloses the configuration of a diode with a Schottky barrier that is said to be suitable for detection of UV radiation (wavelength<200 nm) with shielding of visible light. The Schottky barrier forms at a boundary layer at the junction of a Pt layer to n⁻ doped GaN. The active area of the diode achieves dimensions of 0.25 cm² to 1 cm².

U.S. Pat. No. 7,285,857B2 discloses the configuration of a transparent ohmic-conducting electrode for solar cells. The solar cells are comprised in this connection of GaN. The electrode configuration provides a transparent structure of Zn-based material with a cover layer of a thinly applied metal or a transparent conductive oxide.

WO 2008/143526 A1 discloses rectifying and ohmic contacts that comprise metal oxides or metals of zinc oxide substrates. The rectifying contacts are generated in that a conducting layer is applied onto the zinc oxide and between the layers a rectifying boundary layer is formed. The mechanisms correspond to those of Schottky contacts known from metal semiconductor layer arrangements. The disclosed contact structures are not transparent, however.

WO 01/15241 A1 discloses a sensor for UV radiation. In this connection, on a substrate an optical absorption layer is arranged on which a Schottky contact is generated by means of a further layer. The Schottky contact is covered by a layer of conducting oxide (ITO). The sensor has moreover two ohmic contacts that are arranged separate from the Schottky contact. As a transparent semiconductor a metal nitride (GaN) is used.

The subject matter of U.S. 2007/0206651 A1 is a light emitting diode that has provided on a substrate an active layer between two boundary layers wherein on the upper boundary layer a contact structure of indium gallium nitride is arranged whose band gap decreases layerwise and is at minimum on its topside where it is covered by a transparent electrode. Since U.S. 2007/0206651 A1 describes an LED, this is necessarily a layer structure of a p-conducting and an n-conducting semiconductor layer. Therefore, in this bipolar component the rectification is effected by the p-n junction and not by rectification at a boundary surface of metal oxide and semiconductor.

It is therefore the object to provide the configuration and a method for producing a transparent rectifying contact structure. Moreover, application possibilities for the transparent rectifying layer structure are to be disclosed.

The term "transparent" is to be understood in the following as meaning passage of light through the layer system of at least 50%, preferably 75% or more, of the impinging luminous flux in the considered spectral range. The considered spectral range comprises preferably visible light in a wavelength range of 380-780 nm.

SUMMARY OF THE INVENTION

According to the invention the object is solved by a transparent rectifying contact structure comprising the following components:
a) a transparent semiconductor, selected from the group of wide gap semiconductors, the group containing ZnO, diamond, ZnMgO, $CuAlO_2$, ZnS, ZnSe, ZnCdO, $Ga_2O_3$, $In_2O_3$ and organic semiconductors,
b) a transparent non-insulating and non-conducting layer of metal oxide, metal sulfide and/or metal nitride, wherein the specific resistivity of the layer is preferably in the range of $10^2$ Ωcm to $10^7$ Ωcm, and
c) a layer of a transparent electrical conductor,
wherein the layer b) is formed between the semiconductor a) and the layer c). The use of a transparent rectifying contact structure in applications of sensor technology is also the subject matter of the present invention A method for producing a transparent rectifying contact structure is disclosed that comprises the following steps: providing a transparent semiconductor a) selected from the group of wide gap semiconductors, the group containing ZnO, diamond, ZnMgO, $CuAlO_2$, ZnS, ZnSe, ZnCdO, $Ga_2O_3$, $In_2O_3$ and organic semiconductors: applying a transparent non-insulating and non-conducting layer b) of a metal oxide, metal sulfide and/or metal nitride onto select areas of the semiconductor a), wherein the specific resistivity of the layer is preferably in the range of $10^2$ Ωcm to $10^7$ Ωcm; and applying a layer c) of a transparent electrical conductor onto the select areas of the semiconductor a), wherein the layer c) is separated from the semiconductor a) by the layer b). Possibilities for use of the transparent rectifying contact structure are as follows: optoelectronics, solar technology. sensor technology, signal detection, signal processing and data processing, in display elements, displays, and integrated circuits. Advantageous embodiments are disclosed in the dependent claims.

DESCRIPTION OF PREFERRED EMBODIMENTS

A determining factor for the transparency of a semiconductor or metal oxide is the band gap separating the conduction band from the valence band or the layer thickness correlated with the absorption coefficient. For producing semiconductors that are transparent also in the visible range, gallium nitride, zinc oxide and other nitride or oxide compounds are therefore used. In this connection, in particular indium tin oxide (Indium Tin Oxide, ITO), fluorine tin oxide (Fluorine Tin Oxide, FTO) aluminum zinc oxide (Aluminum Zinc Oxide, AZO), and antimony tin oxide (Antimony Tin Oxide, ATO) are to be mentioned.

The invention discloses a rectifying contact structure that is preferably transparent and comprises a) a semiconductor that is preferably transparent and preferably embodied as a semiconductor layer,
b) a layer of transparent metal oxide, transparent metal nitride or transparent metal sulfide, and
c) a layer of a transparent electrical conductor in the aforementioned sequence.

The components a) to c) form together a layer system that is preferably configured such that the layer c) does not contact the semiconductor a).

In order to ensure the transparency of the layer system, advantageously semiconductors a) with a great band gap, for example, ZnO, GaN or further transparent semiconductors such as diamond, AlN, ZnMgO, $CuAlO_2$, AllnN, ZnS, ZnSe, AlGaN, ZnCdO, $Ga_2O_3$, $In_2O_3$ or InGaN are used. Also, organic semiconductors can be used. When transparency across the entire visible spectral range (380-780 nm) is not required, for example, for uses in the infrared spectral range, other semiconductors such as Si, Ge, GaAs, InP, GaP, etc. are possible also.

The semiconductors can be formed as a volume material, as a thin layer or as a nanostructure.

Onto the semiconductor a) a metal oxide layer b) is applied. In order to ensure the transparency of the metal oxide layer, it must be sufficiently thin. Such thin metal oxide layers have however a minimal lateral conductivity. In order to enable a homogenous injection of charge carriers or a uniform electrical voltage across the surface area of the contact structure, a transparent electrically conductive layer is therefore applied onto the metal oxide layer. This transparent electrical conductor forms preferably the uppermost layer of the layer system. As a material in this connection thin and thus also transparent metals can be used or a highly conductive transparent oxide (for example, AZO, ITO, FTO, ATO etc.) is used.

In the aforementioned combination, the layer system is transparent for an application-specific spectral range and exhibits at the same time a high rectification. The high rectification is achieved by use of non-insulating and non-conducting metal oxides (whose specific resistivity is between that of the conducting and the non-conducting materials) that, in comparison to conventionally employed pure metals, have a higher work function.

Preferably, at least one of the aforementioned components
a) transparent semiconductor,
b) transparent metal oxide, transparent metal nitride or transparent metal sulfide, and
c) transparent electrical conductor
is itself also constructed of layers.

The semiconductor a) is preferably optionally doped, mixed with other elements or compounds, or alloyed.

Preferably, the semiconductor (component a)) is applied onto a substrate and the contact structure is then built based thereupon. Alternatively, the semiconductor is a volume material and forms itself the substrate for the further layer construction. The substrate itself can be advantageously transparent and/or flexible. The radii of curvature of a flexible substrate reach preferably more than 2 cm, even more preferred 0.5 cm and especially preferred 1 mm or less. As suitable materials for the substrate, for example, plastic materials, glass, sapphire, silicon, $SiO_2$, ZnO, GaN are used.

The semiconductor a) is advantageously also formed as a heterostructure. In this way, it is possible that the semiconductor is comprised of a sequence of thin layers of different materials that, optionally, repeat periodically. In this connection, advantageously different semiconductors are also used in the layer sequence. The charge carrier density in the semiconductor is preferably in the range of $10^{12}$ to $10^{19}$ cm$^{-3}$ and especially preferred in the range of $10^{14}$ to $10^{18}$ cm$^{-3}$.

The material of the layer b) has advantageously a high work function. For example, the oxides, nitrides, and sulfides of Ag, Pt, Ir, Cu, Pd, Cr, Ni and other metals can be used. It is preferred to replace the metal oxide by a metal nitride or metal sulfide. The layer b) is preferably thinner than 30 nm, especially preferred thinner than 20 nm, and more particularly preferred thinner than 10 nm, in order to ensure transparency. The material of the layer b) is non-insulating. The conductivity of the layer b) is improved when the metal oxide, the metal nitride, or the metal sulfide is mixed or doped with suitable materials. The specific resistivities of the layer b) are preferably in the range of $10^2$ Ωcm to $10^7$ Ωcm. The material of the layer b) is thus also not conducting but its specific resistivity is in the range between that of the conducting materials and the insulating materials.

Also, layering of different metal oxides, metal nitrides or metal sulfides is possible. Preferably, the metal oxide, metal nitride or metal sulfide contains more metal atoms than predetermined by the stoichiometric ratio.

The layer of the transparent electrical conductor (layer c)) has advantageously a thin transparent metallic layer (e.g. Au, Ag, Pt) or a suitable transparent conducting oxide (TCO: for example, ITO, FTO, AZO, and ATO). The layer of the transparent electrical conductor forms preferably the uppermost layer of the contact structure. The layer c) is preferably chemically stable. When the layer of the transparent electrical conductor is a metal, this layer is thin enough in order to be transparent. A maximum thickness of 20 nm was found to be advantageous; the thickness depends on the employed metal. The specific resistivities of the layer c) are preferably in the range of $10^{-4}$ Ωcm to $10^{-5}$ Ωcm and further preferred in the range of 1 Ωcm to $10^{-6}$ Ωcm.

The transparent metallic layer can be doped and/or may contain a substance mixture and/or may be comprised of several layers. When the transparent electrical conductor comprises a conductive metal oxide (TCO), the latter may contain more metal atoms than predetermined by the stoichiometric ratio. Advantageously, the layer of the transparent electrical conductor can also comprise an organic conductive material such as PEDOT:pss (poly(3,4-ethylene dioxythiophene) poly(styrene sulfonate). Advantageously, the layer c) does not cover the layer b) completely in order to avoid edge currents between the layer c) and the semiconductor a). The layer c) covers the layer b) preferably to 90% up to 100%, even more preferred 95% to 98%.

It is preferred to apply onto the transparent layer c) a cover layer as an additional layer. Advantageously, the light admission into the transparent rectifying contact structure is improved in that the cover layer has anti-reflective properties that facilitate light admission into the layer system. This cover layer has a thickness of at least 3 nm. The cover layer covers advantageously not only the transparent contact structure but may also extend across the entire component in which the transparent contact structure is embodied or across areas of the semiconductor structure to which the transparent contact structure belongs, wherein possible connectors or bonding contacts may be excluded. The cover layer, in turn, may be doped also and/or may contain a substance mixture, may be alloyed and/or may be of a multi-layer structure. The cover layer extends advantageously not only on the top side of the transparent contact structure but also on its sides so that it covers also the edges of the layers that are underneath and/or areas of the component to which the transparent rectifying contact structure belongs. The cover layer acts to passivate and is thus electrically non-conducting (insulator). The specific resistivity of the cover layer is preferably at least at $10^{10}$ $\Omega$cm and in particular preferred approximately at $10^{12}$ $\Omega$cm and higher. The use of dielectric media such as $HfO_2$, $Al_2O_3$, $ZrO_2$, $SiO_x$, $Si_3N_4$ and others is advantageous. However:, also suitable are organic cover layers such as PMMA or epoxide resins or their mixtures with dielectric media. The cover layer acts preferably also chemically passivating, so that the layers underneath are protected against chemical changes. For producing the cover layer, established deposition methods such as cathode evaporation (sputtering), spin coating, dip coating, atomic layer deposition (ALD), pulsed laser deposition (PLD), and others are used. When it is used in a component in which, for example, transistor structures are formed, the cover layer reduces, on the one hand, leakage flows in particular across the component surface between source and drain. On the other hand, when used in a transparent contact structure, currents along the edges of the metal oxide layer between the transparent metallic layer and the semiconductor underneath are suppressed. This reduces the off-current (current that continues to flow in the switched-off state of a component) and thus the power input of the component in the off state (switched-off state). The reduction of the off-current increases also the dynamics of the component (ratio between on-current and off-current; on-state is the switched-on state, on-current is the current in the switched-on state).

For producing the transparent rectifying contact structure, a semiconductor crystal or a semiconductor layer is preferably doped in a suitable fashion. As a semiconductor for transparent contact structures with light transmissivity in the visible range in particular ZnO with suitable doping (e.g. Al) is suitable. Subsequently, the semiconductor is structured by means of known methods (e.g. wet etching or dry etching) or suitable structures are grown on the semiconductor surface or the surface of a substrate and the latter subsequently doped. Optionally, the semiconductor is subjected to a purification process, for example, by means of plasma. Onto the corresponding structures of the semiconductor a) a transparent layer b) of metal oxide, metal sulfide or metal nitride is applied. This is done, for example, by reactive or non-reactive sputtering (DC, AC, magnetron), pulsed layer deposition (PLD), molecular beam epitaxy (MBE), atomic layer deposition (ALD), chemical gas phase deposition (CVD/PECVD), organometallic gas phase epitaxy (MOVPE) or appropriate other methods known in the art.

Advantageously, a metal layer is applied for this purpose and then oxidized in a targeted fashion. Preferably, the layer b) is generated of several layers of one or different metal oxides, metal sulfides or metal nitrides by sequential application of individual layers. The layer b) is preferably formed cross-structurally and subsequently structured or generated by being grown onto the desired structure. Optionally, the material of the layer b) is after-treated, for example, by further oxidation or heating.

Onto the layer b) a transparent electrical conductor is applied as a layer c). The layer c) itself can be comprised of layers of the same or different transparent electrical conductors. The transparent electrical conductor is formed by a suitable metal (e.g. Pt, Au) and/or a transparent metal oxide and/or an organic conductor. Metal layers must be embodied to be appropriately thin for maintaining the transparency. For forming the metallic layers, methods known in the art are used. When the transparent electrical conductor is comprised of a transparent metal oxide, preferably AZO, ITO, ATO, or FTO is used. The layer of a transparent electrical conductor is subsequently formed cross-structurally and subsequently structured or generated by being grown on the desired structure.

Optionally, the layer of a transparent electrical conductor is suitably after-treated in that, for example, it is provided with a cover layer or additional layer. Preferably, the cover layer covers the topside of the transparent rectifying contact structure such that the layer c) is arranged between layer b) and the additional cover layer. The cover layer can have anti-reflective properties and/or can act chemically and/or electrically passivating. The cover layer is advantageously generated of an electrically non-conducting material (e.g. $HfO_2$, $Al_2O_3$, $ZrO_2$, $SiO_x$, $Si_3N_4$ etc. but also organic material, for example, PMMA (polymethyl methacrylate or epoxide resin)) by means of known processes. These processes are, for example, cathode evaporation (sputtering), spin coating, dip coating, atomic layer deposition (ALD), pulsed laser deposition (PLD).

The rectifying contact structures according to the invention are used advantageously in electronic components such as integrated circuits, light emitting diodes and photo diodes, photo transistors and the like. The rectifying contact structures according to the invention are moreover advantageously used in applications such as optoelectronics, solar technology, sensor technology, signal detection, signal processing and data processing as well as for the production of display elements, displays and the like. In particular, use of the rectifying contact structure according to the invention as UV photodetector is advantageous.

The invention will be explained in the following in more detail by means of embodiments which however are not to be viewed as limiting.

Embodiments

Embodiment 1: Rectifying Transparent Au/$Ag_xO$ Contact on Hetero-Epitaxial ZnO Thin Film By pulsed laser deposition (PLD), a zinc oxide layer that is approximately 1 micrometer thick is deposited onto an a-sapphire substrate. Without surface pre-treatment, transparent $Ag_xO$ point contacts (thickness<10 nm) are applied by reactive sputtering of silver in an argon/oxygen atmosphere and are then covered by a transparent gold layer (thickness<5 nm).

These contact structures act as diodes and can be used as rectifiers and for detection of electromagnetic radiation (photo diode) or of adsorbed molecules (chemical sensor).

Embodiment 2:Contact in a ZnO-Based Transparent MESFET (Metal Semiconductor Field Effect Transistor (English: Metal Semiconductor Field Effect Transistor, MESFET))

By pulsed laser deposition (PLD) an approximately 20 nm thick zinc oxide layer is deposited on an a-sapphire substrate. From this layer a mesa is produced by etching. Based on the above described contacts by reactive sputtering of silver a transparent $Ag_xO$ gate contact is applied onto the mesa. Subsequently, by means of PLD transparent aluminum-doped highly conductive zinc oxide as a cover layer is applied. The source and drain contacts are also produced by PLD of transparent aluminum-doped highly conductive zinc oxide.

Based on these MESFETs fully transparent integrated circuits (e.g. inverters, logic elements) can be produced. They can be, for example, also used as transparent switching elements for pixel control in active matrix liquid crystal display elements or OLED displays.

What is claimed is:

1. A transparent rectifying contact structure comprising:
   a) a transparent semiconductor, selected from a group of wide band gap semiconductors, the group containing consisting of ZnO, diamond, ZnMgO, $CuAlO_2$, ZnS, ZnSe, ZnCdO, $Ga_2O_3$, $In_2O_3$ and organic semiconductors,
   b) a transparent non-insulating and non-conducting first layer of at least one compound selected from a metal oxide, a metal sulfide, and a metal nitride, wherein the specific resistivity of the layer is in the range of $10^2$ $\Omega$cm to $10^7$ $\Omega$cm, and
   c) a second layer of a transparent electrical conductor, wherein the first layer is formed between the semiconductor and the second layer.

2. The transparent rectifying contact structure according to claim 1, wherein the metal of the at least one compound of the first layer is selected from the group consisting of Ag, Pt, Ir, Cu, Pd, Cr, Ni and other metals.

3. The transparent rectifying contact structure according to claim 2, comprising a substrate that is transparent; or flexible; or transparent and flexible.

4. The transparent rectifying contact structure according to claim 1, wherein the semiconductor is in the form of a volume material, a thin layer or a nanostructure.

5. The transparent rectifying contact structure according to claim 1, wherein the semiconductor is doped and/or mixed and/or alloyed and/or has heterostructures.

6. The transparent rectifying contact structure according to claim 1, wherein the first layer is comprised of several layers.

7. The transparent rectifying contact structure according to claim 1, wherein the first layer contains more metal atoms than is predetermined by the stoichiometric ratio of the at least one compound.

8. The transparent rectifying contact structure according to claim 1, wherein the second layer comprises at least one of:
   i) a transparent conductive oxide, selected from the group consisting of indium tin oxide, fluorine tin oxide, aluminum zinc oxide, and antimony tin oxide;
   ii) a metal of the group consisting of Au, Ag, Pt, Cu, In;
   iii) an organic conductive material.

9. The transparent rectifying contact structure according to claim 8, wherein the second layer is doped and/or a mixture and/or is alloyed and/or is comprised of several layers.

10. The transparent rectifying contact structure according to claim 8, wherein the second layer comprises a metal oxide containing more metal atoms than predetermined by the stoichiometric ratio of the metal oxide.

11. The transparent rectifying contact structure according to claim 1 as a component in optoelectronics, solar technology, sensor technology, signal detection, signal processing and data processing, in display elements, displays, and integrated circuits.

12. A transparent rectifying contact structure for applications in sensor technology, wherein the contact structure comprises:
    a) a transparent semiconductor,
    b) a transparent non-insulating and non-conducting first layer of an oxide, sulfide or nitride of a metal selected from a group consisting of Ag, Pt, Ir, Cu, Pd, Cr and other metals, wherein the specific resistivity of the layer is preferably in the range of $10^2$ $\Omega$cm to $10^7$ $\Omega$cm, and
    c) a second layer of a transparent electrical conductor, wherein the first layer is formed between the semiconductor and the second layer.

13. A method for producing a transparent rectifying contact structure, the method comprising:
    providing a transparent semiconductor selected from a group of wide band gap semiconductors, the group consisting of ZnO, diamond, ZnMgO, $CuAlO_2$, ZnS, ZnSe, ZnCdO, $Ga_2O_3$, $In_2O_3$ and organic semiconductors,
    applying a transparent non-insulating and non-conducting first layer, comprised of at least one of a metal oxide, a metal sulfide, and a metal nitride onto select areas of the semiconductor, wherein the specific resistivity of the first layer is preferably in the range of $10^2$ $\Omega$cm to $10^7$ $\Omega$cm,
    applying a second layer of a transparent electrical conductor onto the select areas of the semiconductor, wherein the second layer is separated from the semiconductor by the first layer.

14. The method according to claim 13, wherein the semiconductor is doped and/or is purified on its surface.

15. The method according to claim 13, wherein the first layer is formed by oxidation of a metal layer or by sequential formation of several layers of the same or different metal oxides.

16. The method according to claim 13, wherein the second layer is formed by sequential formation of several layers of the same or different transparent electrical conductors.

17. A method for producing a transparent rectifying contact structure for applications in sensor technology, wherein the method comprises the following steps:
    providing a transparent semiconductor, selected from a group of wide band gap semiconductors, the group consisting of ZnO, diamond, ZnMgO, $CuAlO_2$, ZnS, ZnSe, ZnCdO, $Ga_2O_3$, $In_2O_3$ and organic semiconductors,
    applying a transparent non-insulating and non-conducting first layer, comprised of at least one of an oxide, a sulfide and a nitride of a metal selected from the group consisting of Ag, Pt, Ir, Cu, Pd, Cr and other metals, onto select areas of the semiconductor, wherein the specific resistivity of the layer is preferably in the range of $10^2$ $\Omega$cm to $10^7$ $\Omega$cm,
    applying a second layer of a transparent electrical conductor onto the select areas of the semiconductor, wherein the second layer is separated from the semiconductor by the first layer.

* * * * *